United States Patent
Kim (10) Patent No.: US 9,232,633 B2
(45) Date of Patent: Jan. 5, 2016

(54) CIRCUIT BOARD FOR DISPLAY DEVICE AND DISPLAY DEVICE HAVING THE SAME

(71) Applicant: Hun Tae Kim, Yongin (KR)

(72) Inventor: Hun Tae Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 295 days.

(21) Appl. No.: 13/683,457

(22) Filed: Nov. 21, 2012

(65) Prior Publication Data

US 2013/0141912 A1 Jun. 6, 2013

(30) Foreign Application Priority Data

Dec. 6, 2011 (KR) ........................ 10-2011-0129858

(51) Int. Cl.
| | |
|---|---|
| H05K 1/14 | (2006.01) |
| H05K 1/00 | (2006.01) |
| H05K 1/02 | (2006.01) |
| F21V 23/00 | (2015.01) |
| H05K 3/36 | (2006.01) |
| H05K 1/18 | (2006.01) |
| H01L 27/32 | (2006.01) |

(52) U.S. Cl.
CPC ............ *H05K 1/0277* (2013.01); *F21V 23/001* (2013.01); *H05K 3/363* (2013.01); *H01L 27/3276* (2013.01); *H05K 1/141* (2013.01); *H05K 1/189* (2013.01)

(58) Field of Classification Search
CPC ......... H05K 1/11; H05K 1/111; H05K 1/118; H05K 1/147

USPC .......... 174/254, 260, 261; 361/749, 760, 767, 361/784, 789, 790, 792, 803
See application file for complete search history.

(56) References Cited

U.S. PATENT DOCUMENTS

| | | | |
|---|---|---|---|
| 6,469,255 B2* | 10/2002 | Watanabe et al. ............. | 174/254 |
| 6,618,111 B1* | 9/2003 | Nagata et al. ................. | 349/149 |
| 6,739,879 B2* | 5/2004 | Sprietsma et al. ............. | 439/69 |
| 6,972,966 B1* | 12/2005 | Oishi et al. .................... | 361/803 |
| 7,414,694 B2* | 8/2008 | Furukoshi ..................... | 349/151 |
| 2005/0156295 A1* | 7/2005 | Corisis et al. ................. | 257/668 |
| 2007/0167036 A1 | 7/2007 | Kim | |
| 2008/0048948 A1* | 2/2008 | Koh et al. ....................... | 345/80 |
| 2011/0115731 A1* | 5/2011 | Kuwajima ..................... | 345/173 |

FOREIGN PATENT DOCUMENTS

| | | |
|---|---|---|
| JP | 09-307208 A | 11/1997 |
| JP | 2009-016609 A | 1/2009 |
| KR | 10-2006-0036623 A | 5/2006 |
| KR | 10-2007-0075474 A | 7/2007 |
| KR | 10-2007-0116371 A | 12/2007 |
| KR | 10-2008-0017773 A | 2/2008 |

\* cited by examiner

*Primary Examiner* — Hoa C Nguyen
(74) *Attorney, Agent, or Firm* — Lee & Morse, P.C.

(57) ABSTRACT

Disclosed is a circuit board for display device which includes a main circuit board and a flexible circuit board. The main circuit board has a power input pad and a power receiving pad that are exposed to the outside. A power supply voltage is applied to the power input pad. The flexible circuit board is coupled on one surface of the main circuit board. The flexible circuit board is configured to electrically connect the power input pad and the power receiving pad. A display device including the circuit board has a panel input pad receiving the power supply voltage from the main circuit board.

21 Claims, 7 Drawing Sheets

CIRCUIT BOARD FOR DISPLAY DEVICE AND DISPLAY DEVICE HAVING THE SAME

CROSS-REFERENCE TO RELATED APPLICATIONS

A claim for priority under 35 U.S.C. §119 is made to Korean Patent Application No. 10-2011-0129858 filed Dec. 6, 2011, the entirety of which is incorporated by reference herein.

BACKGROUND

1. Field

One or more embodiments relate to a circuit board for display device and a display device including the same.

2. Description of the Related Art

A large-scaled display device and an increase in pixels necessitate sufficient supplying of a power supply voltage. In order to supply a power stably, a display device is configured to a power supply voltage to a display panel using a separate circuit board.

A display device has been designed to widen a display area and to narrow a vessel region (or, a non-display area). Reduction of the vessel region forces a mounting area of a circuit board to be reduced. As an upper area of the circuit board is reduced, the higher integration of circuit and a multi-layer structure are required.

As described above, as a design of a circuit board is varied, a cost needed to make a display device and a circuit board may rise.

In a circuit board with a narrow area, if a power supply voltage is transferred via an inner layer of the circuit board, it may affect peripheral signal terminals. This means that signal interference is generated. Thus, a malfunction of the display device is caused.

SUMMARY

One or more embodiments provide a circuit board for display device comprises a main circuit board and a flexible circuit board. The main circuit board includes a power input pad supplied with a power supply voltage and a power receiving pad, the power input and receiving pads being exposed to the outside. The flexible circuit board is connected on one surface of the main circuit board and is configured to electrically connect the power input pad and the power receiving pad.

The power input pad may include a first power input pad supplied with a first power supply voltage and a second power input pad supplied with a second power supply voltage different from the first power supply voltage. The power receiving pad includes a first power receiving pad electrically connected to the first power input pad and a second power receiving pad electrically connected to the second power input pad.

The main circuit board may include a first power output pad and a second pad output pad electrically connected to the first power receiving pad and the second power receiving pad, respectively. The first power output pad and the second pad output pad are provided at the other surface that is opposite to one surface at which the power receiving pad is provided.

The flexible circuit board may include a flexible base member; and a plurality of circuit wirings provided at the flexible base member. The circuit wirings comprise a first circuit wiring connecting the first power input pad and the first power receiving pad; and a second circuit wiring connecting the second power input pad and the second power receiving pad.

The flexible base member may include a plurality of insulation layers being sequentially stacked, the first circuit wiring and the second circuit wiring being respectively provided on one surfaces of different ones of the insulation layers.

Each of the first and second circuit wirings includes a first pad portion exposed to the outside; a second pad portion spaced apart from the first pad portion and exposed to the outside; and a wiring portion connecting the first pad portion and the second pad portion.

In one or more embodiments, the main circuit board further comprises a first signal terminal and a second signal terminal each being exposed to the outside. The flexible circuit board further comprises a third circuit wiring connecting the first signal terminal and the second signal terminal.

The power input pad and the power receiving pad may be arranged along a peripheral portion of the main circuit board.

The flexible circuit board may overlap at least a portion of a central portion of the main circuit board and the peripheral portion of the main circuit board.

Example embodiments o provide a display device comprising a display panel and a circuit board providing the display panel with a power supply voltage. The circuit board includes a main circuit board and a flexible circuit board. The main circuit board includes a power output pad that is provided at the other surface and is electrically connected to a power receiving pad provided at one surface. The display panel has a panel input pad that receives the power supply voltage from the main circuit board.

The display panel includes a display area having a plurality of signal lines and a plurality of pixels respectively connected to the plurality of signal lines; and a non-display area adjacent to the display area, the panel input pad being disposed at the non-display area.

Each of the plurality of pixels may include an organic light emitting diode emitting a light in response to the power supply voltage.

BRIEF DESCRIPTION OF THE FIGURES

Features will become apparent from the following description with reference to the following figures, wherein like reference numerals refer to like parts throughout the various figures unless otherwise specified, and wherein.

DETAILED DESCRIPTION

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
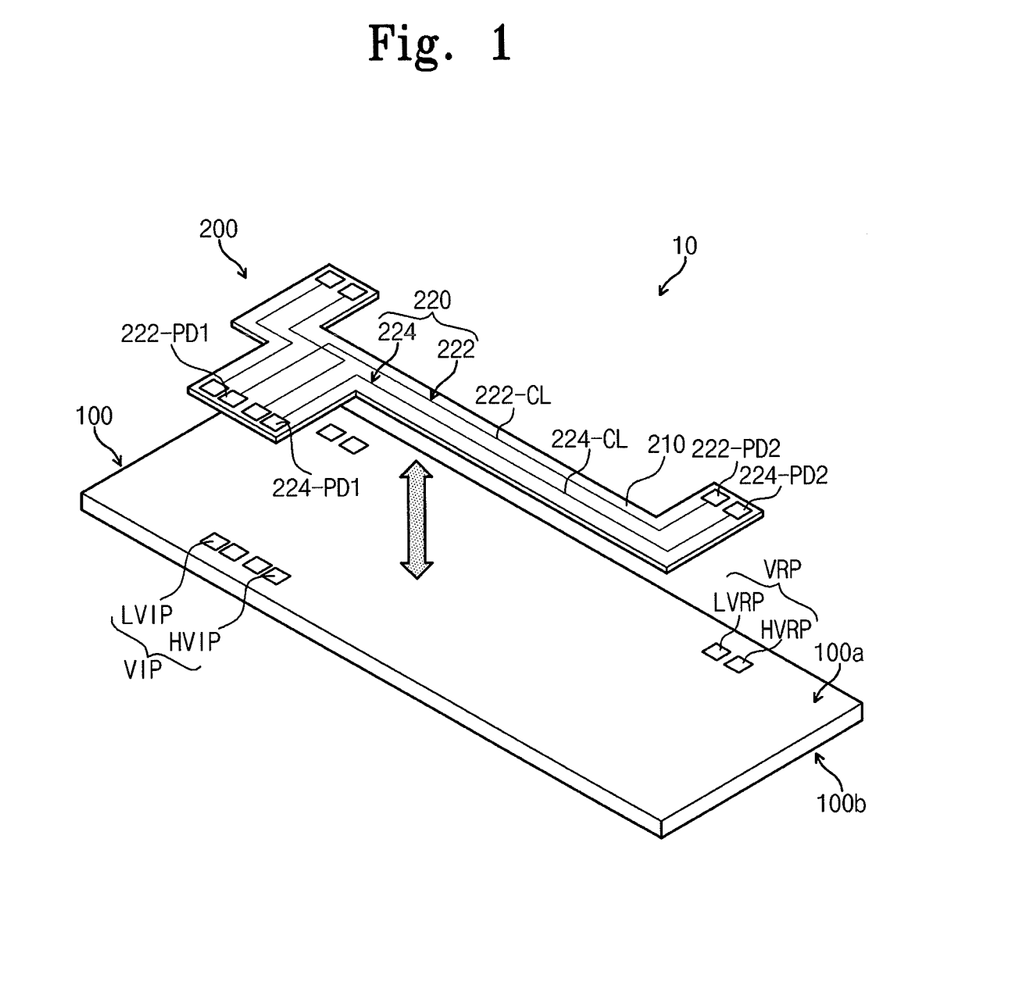
FIG. 1 illustrates a plan view of an exemplary embodiment of a circuit board.
Figure 2:
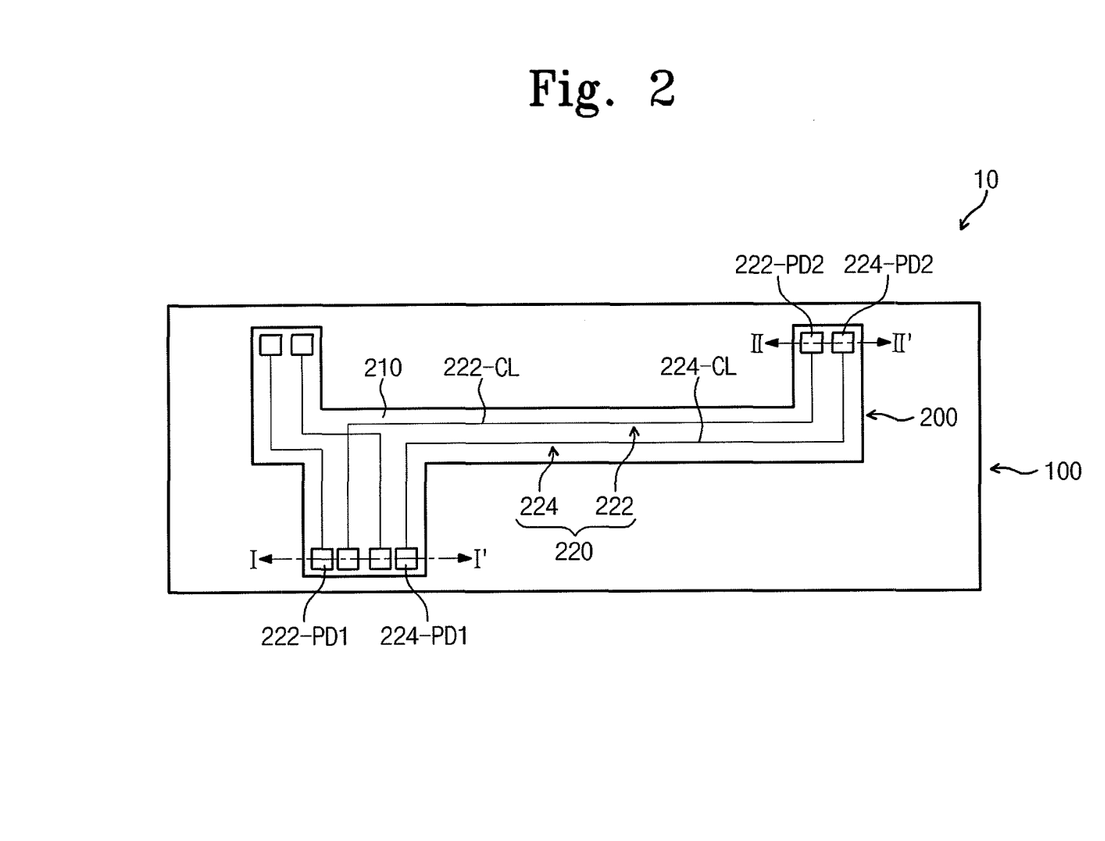
FIG. 2 is a top-plan view of the circuit board illustrated in FIG. 1.
Figure 3:
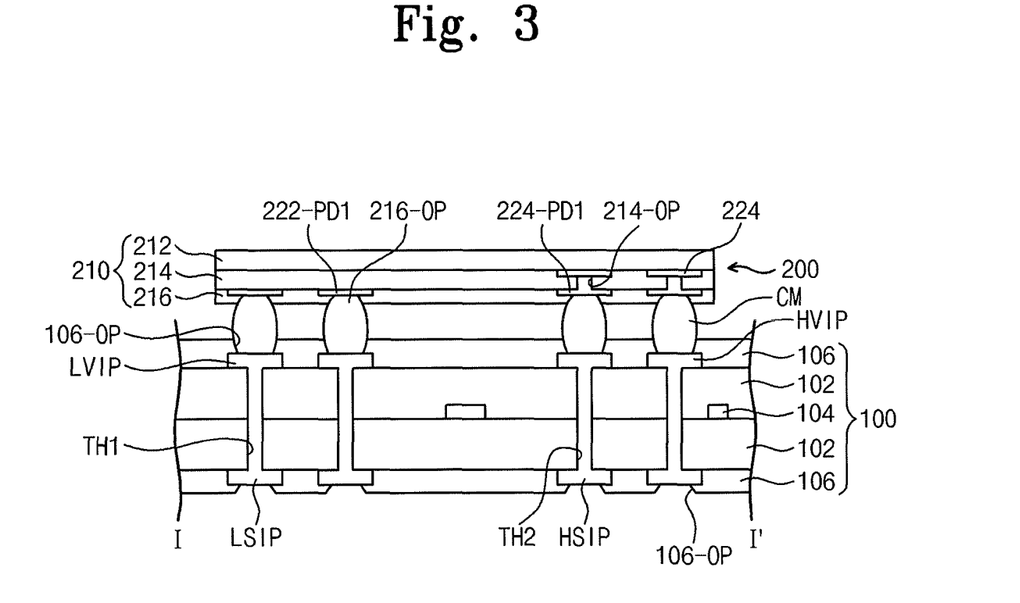
FIG. 3 illustrates a cross-sectional view taken along a line I-I' in FIG. 2.
Figure 4:
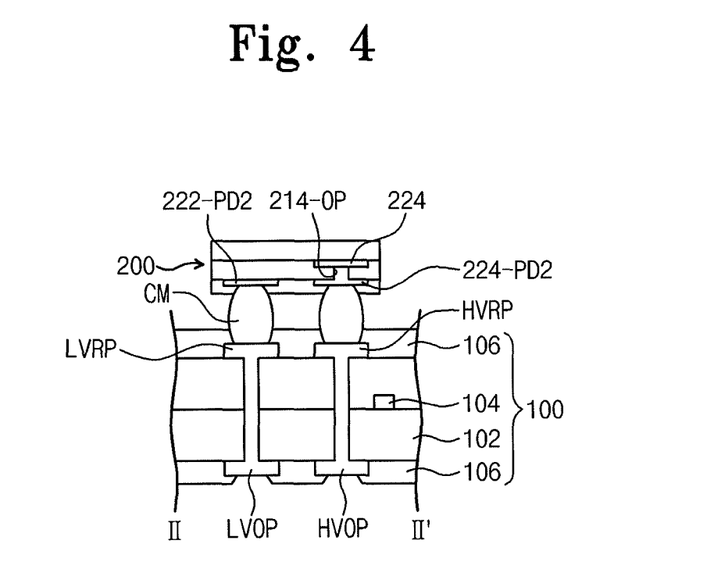
FIG. 4 illustrates a cross-sectional view taken along a line II-II' in FIG. 2.

FIG. 1 illustrates an exploded perspective view of an exemplary embodiment of a circuit board 10. FIG. 2 illustrates a top-plan view of the circuit board illustrated in FIG. 1. FIG. 3 illustrates a cross-sectional view of the circuit board taken along a line I-I' in FIG. 2. FIG. 4 illustrates a cross-sectional view of the circuit board taken along a line II-II' in FIG. 2. An exemplary embodiment of the circuit board for a display device will be more fully described with reference to FIGS. 1 through 4.

As illustrated in FIGS. 1 through 4, in one or more embodiments, the circuit board 10 for a display device (hereinafter, referred to as a circuit board) may include a main circuit board 100 and a flexible circuit board 200.

The main circuit board 100 includes a power input pad VIP supplied with a power supply voltage and a power receiving pad VRP receiving the power supply voltage from the power input pad VIP. The power input pad VIP and the power receiving pad VRP are exposed to the outside. The main circuit board 100 may be configured to mount passive elements (not shown) such as inductors and capacitors and active elements (not shown) such as gate driver chips or data driver chips.

The power input pad VIP includes a first power input pad LVIP supplied with a first power supply voltage and a second power input pad HVIP supplied with a second power supply voltage different from the first power supply voltage. The first power supply voltage may be lower in level than the second power supply voltage. For example, a polarity of the first power supply voltage may be negative, and a polarity of the second power supply voltage may be positive.

In the exemplary embodiment of FIGS. 1 and 2, two of each of the first and second power input pads LVIP and HVIP are illustrated. However, a number of each of the first and/or second power input pads LVIP and HVIP may be less than or more than two (2).

The power receiving pad VRP includes a first power receiving pad LVRP electrically connected to the first power input pad LVIP and a second power receiving pad HVRP electrically connected to the second power input pad HVIP. The first power input pad LVIP and the second power input pad HVIP may be arranged on a first side 100a, e.g., upper side, of the main circuit board 100. As illustrated in FIGS. 1 and 2, the first power receiving pad LVRP and the second power receiving pad HVRP may be paired. A pair of the first power receiving pad LVRP and the second power receiving pad HVRP may be provided at two regions, respectively.

The flexible circuit board 200 is coupled on one surface of the main circuit board 100. The flexible circuit board 200 electrically connects the power input pad VIP and the power receiving pad VRP.

The flexible circuit board 200 includes a flexible base member 210 and a plurality of circuit wirings 220 provided at the flexible base member 210.

The circuit wirings 220 includes a first circuit wiring 222 connecting the first power input pad LVIP and the first power receiving pad LVRP and a second circuit wiring 224 connecting the second power input pad HVIP and the second power receiving pad HVRP. In the exemplary embodiment of FIGS. 1 and 2, two of each of the first circuit wiring 222 and the second circuit wiring 224 are illustrated. However, a number of each of the first circuit wiring 222 and the second circuit wiring 224 may be less than or more than two (2).

The first circuit wiring 222 includes a first pad portion 222-PD1, a second pad portion 222-PD2, a wiring portion 222-CL connecting the first pad portion 222-PD1 and the second pad portion 222-PD2. The first pad portion 222-PD1, the second pad portion 222-PD2, and the wiring portion 222-CL are exposed to the outside. The second circuit wiring 224 includes a first pad portion 224-PD1, a second pad portion 224-PD2, a wiring portion 224-CL connecting the first pad portion 224-PD1 and the second pad portion 224-PD2. The first pad portion 224-PD1, the second pad portion 224-PD2, and the wiring portion 224-CL are exposed to the outside.

An exemplary interconnection structure between the main circuit board 100 and the flexible circuit board 200 will be more fully described with reference to FIGS. 3 and 4.

As illustrated in FIGS. 3 and 4, the main circuit board 100 has a multi-layer structure. The main circuit board 100 may have a plurality of insulation layers 102 and a plurality of circuit wirings 104. For example, in FIGS. 3 and 4, there is exemplarily illustrated a case that two insulation layers 102 are sequentially stacked and the circuit wiring 104 is provided between the two insulation layers 102. In one or more embodiments, the plurality of insulation layers 102 and the plurality of circuit wirings 104 may be alternatively stacked. The insulation layers 102 may include a resin such as a phenol resin or an epoxy resin. In one or more embodiments, it is possible to use prepreg including a reinforcement substance which is impregnated into the resin.

The circuit wiring 104 may be formed by forming a metal layer on the insulation layer 102 and patterning the metal layer. In general, the circuit wiring 104 may be formed using an Additive Process (AP), a Semi-Additive Process (SAP), a subtractive manner, or the like.

A protection layer 106 may form an outer layer of the main circuit board 100. The protection layer 106 may prevent the first and second circuit wirings 222 and 224 from being corroded. The protection layer 106 may have an opening portion 106-OP formed to expose the power input pads LVIP and HVIP. The protection layer 106 may include a heat-resisting resin sufficient to endure a temperature at which solder melts. In one or more embodiments, the protection layer 106 can be skipped.

The flexible base member 210 may include a plurality of insulation layers 212 and 214 that are sequentially stacked. In FIGS. 3 and 4, there is exemplarily illustrated a case that two insulation layers 212 and 214 are sequentially stacked. The insulation layers 212 and 214 may include a polyimide resin family such as, e.g., polyimide resin, polyether-imide resin, polyimide-imide resin, or a polyether resin family, etc.

The flexible base member 210 includes a protection layer 216 as an outer layer of the flexible base member 210. The protection layer 216 may be in on one or more sides of the flexible base member 210. The protection layer 216 may include the same material as the protection layer 106 of the main circuit board 100.

Each of the first circuit wiring 222 may be provided at one surface of one of the insulation layers, e.g., 214. The second circuit wiring 224 may be provided at one surface of the other of the insulation layers, e.g., 212. With this structure, in which the first circuit wiring 222 and the second circuit wiring 224 are arranged on different ones of the insulation layers 212, 214, it is possible to prevent the first and second circuit wirings 222 and 224 from being shorted. In the exemplary embodiment of FIGS. 3 and 4, the first circuit wiring 222 is provided on a lower surface of the insulation layer 214 which is disposed closer to the main circuit board 100 than the insulation layer 212. In FIG. 3, the second circuit wiring 224 is provided on a lower surface of the insulation layer 212 that is disposed further away from the main circuit board 100.

As illustrated in FIG. 3, the main circuit board 100 includes outer input pads LSIP and HSIP. The outer input pads LSIP, HSIP may be arranged on a surface of the main circuit board 100. More particularly, e.g., the outer input pads LSIP, HSIP may be arranged on a second side 100b (see FIG. 1), which may be opposite, to the first surface 100a on which the power input pads LVIP and HVIP may be arranged. The power input pads LVIP and HVIP and the outer input pads LSIP and HSIP are electrically connected via through holes TH1 and TH2. In one or more embodiments, the outer input pads LSIP and HSIP may not be provided.

The first pad portion 222-PD1 of the first circuit wiring 222 and the first pad portion 224-PD1 of the second circuit wiring 224 may be exposed by respective opening portions 216-OP provided at the protection layer 216. In the exemplary embodiment of FIGS. 3 and 4, although the first and second circuit wirings 222 and 224 may be provided on surfaces of different ones of the insulation layers 212, 214, the first pad portion 222-PD1 of the first circuit wiring 222 and the first pad portion 224-PD1 of the second circuit wiring 224 may be provided at the same insulation layer. However, embodiments are not limited thereto. For example, the first pad portion 222-PD1 of the first circuit wiring 222 and the first pad portion 224-PD1 of the second circuit wiring 224 can be provided at different planes, e.g., on surfaces of different insulation layers or different surfaces of the same insulation layer. An opening portion 214-OP for exposing the first pad portion 224-PD1 of the second circuit wiring 224 may penetrate both the protection layer 216 and the insulation layer 214.

As illustrated in FIG. 3, the first pad portion 222-PD1 of the first circuit wiring 222 and the first power input pad LVIP are electrically connected by a conductive material CM. Further, the first pad portion 224-PD1 of the second circuit wiring 224 and the first power input pad HVIP are electrically connected by a conductive material CM. The conductive material CM may be a solder.

As illustrated in FIG. 4, the second pad portion 222-PD2 of the first circuit wiring 222 and the first power receiving pad LVRP are electrically connected by a conductive material CM. Further, the second pad portion 224-PD2 of the second circuit wiring 224 and the second power receiving pad HVRP are electrically connected by a conductive material CM.

The main circuit board 100 includes power output pads LVOP, HVOP. The power output pads LVOP, HVOP may be provided at a second side 100b that is opposite to the first side 100a at which the power receiving pads LVRP and HVRP are provided. The power output pads LVOP and HVOP may be electrically connected to a display panel (e.g., DP of FIGS. 6 and 7). More particularly, the first power receiving pad LVRP is connected to the first power output pad LVOP, and the second power receiving pad HVRP is connected to the second power output pad HVOP. The first power receiving pad LVRP and the second power receiving pad HVRP are electrically connected to the first power output pad LVOP and the second power output pad HVOP via through holes penetrating the insulation layers 102, respectively.

Although not shown, a plurality of signal pads may be disposed at the second side 100b of the main circuit board 100 to provide various signals to a display panel as will be more fully described below.

One or more embodiments of a circuit board employing one or more features described herein, e.g., the circuit board 10, may supply a power supply voltage to a display panel without passing through a signal/device portion and/or a central portion of the main circuit board 100. For example, in one or more embodiments, the power supply voltage may be passed to a display panel through peripheral portions of the main circuit board 100 that are coupled to the circuit board 10. The circuit board 10 may be arranged so as to overlap with the central portion of the main circuit board 100. Although the power supply voltage swings and has a large current associated therewith, the power supply voltage does not affect passive and active elements of the main circuit board 100 because it does not pass through a fundamental or central portion of the main circuit board 100. Further, since a separate ground wiring is not provided at an inner layer of the main circuit board 100, it is possible to simplify a structure of the main circuit board 100.

Figure 5:
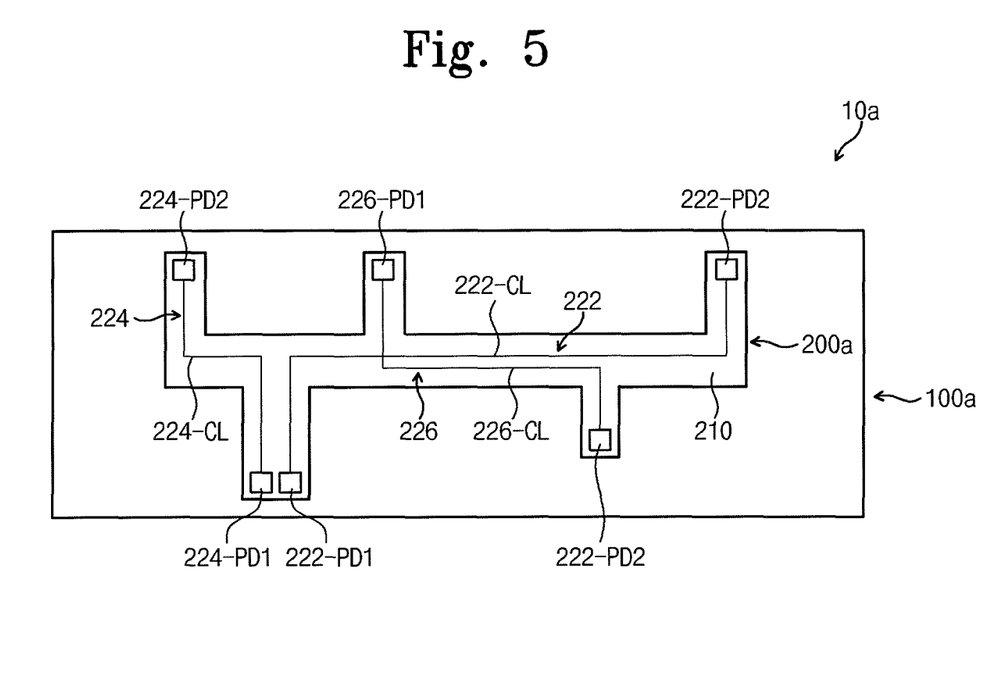
FIG. 5 illustrates a top-plan view of an exemplary embodiment of a circuit board.

FIG. 5 illustrates a top view of a circuit board 10a. In FIG. 5, constituent elements that are identical to those described in relation to FIGS. 1 through 4 are marked by the same reference numerals, and, in general, only differences between the exemplary circuit board 10 of FIGS. 1-4 and the exemplary circuit board 10a of FIG. 5 will be described below.

As illustrated in FIG. 5, the circuit board 10a includes a main circuit board 100a and a flexible circuit board 200a.

The main circuit board 100a may further include a first signal terminal (not shown) and a second signal terminal (not shown) that are exposed to the outside. The first and second signal terminals are terminals electrically connected to different active elements or to active and passive elements.

The flexible circuit board 200a may include one or more third circuit wirings 226. The third circuit wiring 226 may be connected to the first and second signal terminals (not shown). The third circuit wiring 226 includes a first pad 226-PD1 connected to the first signal terminal, a second pad 226-PD2 connected to the second signal terminal, and a wiring portion 226-CL connecting the first pad 226-PD1 and the second pad 226-PD2.

The third circuit wiring 226 may transfer a power supply voltage and/or some driving signals, or may transfer a voltage different in use from the power supply voltage. One or more embodiments employing the first, the second and/or the third wirings may provide a circuit board, e.g., 10, 10a, which has a reduced degree of integration between different elements, e.g., wirings and a main circuit board thereof, e.g., 100, 100a, and/or a reduced degree of interference between signals of the circuit board, e.g., 10, 10a. The flexible circuit board 200a may include a plurality of the third circuit wirings 226.

Figure 6A:
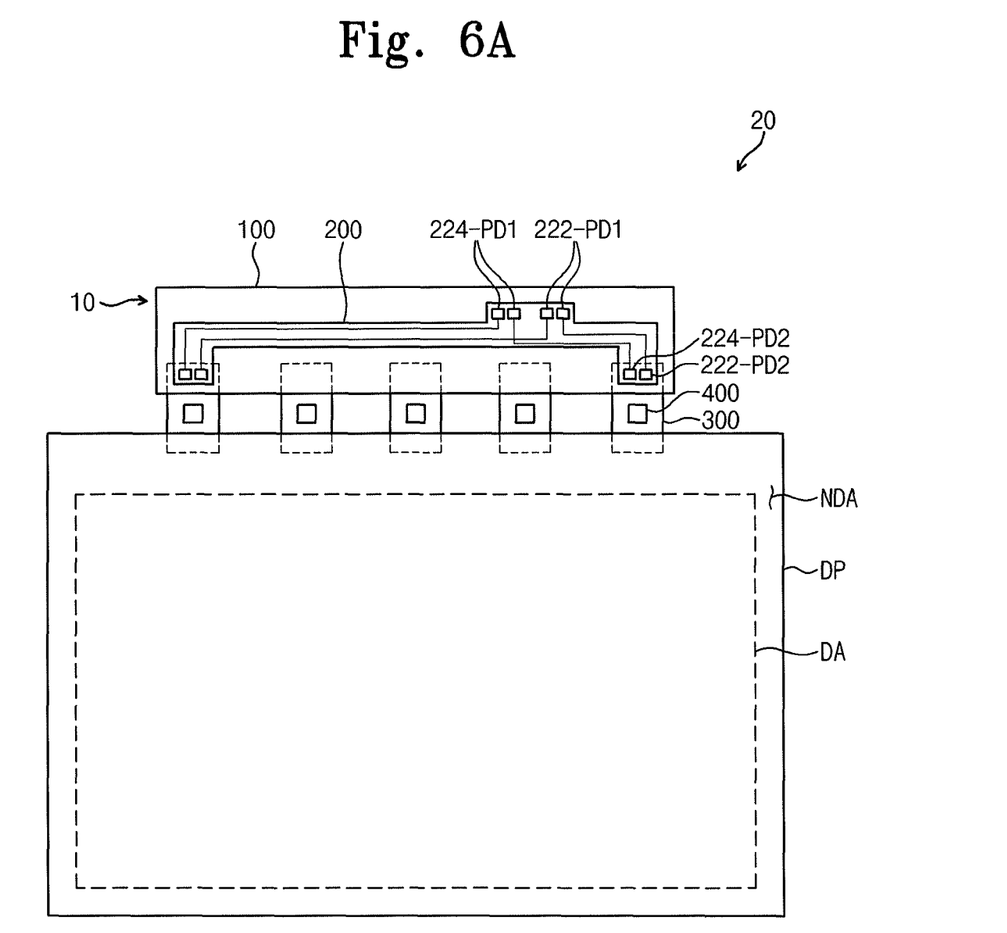
FIGS. 6A and 6B illustrate a top-plan view and a bottom-plan view, respectively, of an exemplary embodiment of a display device.
Figure 6B:
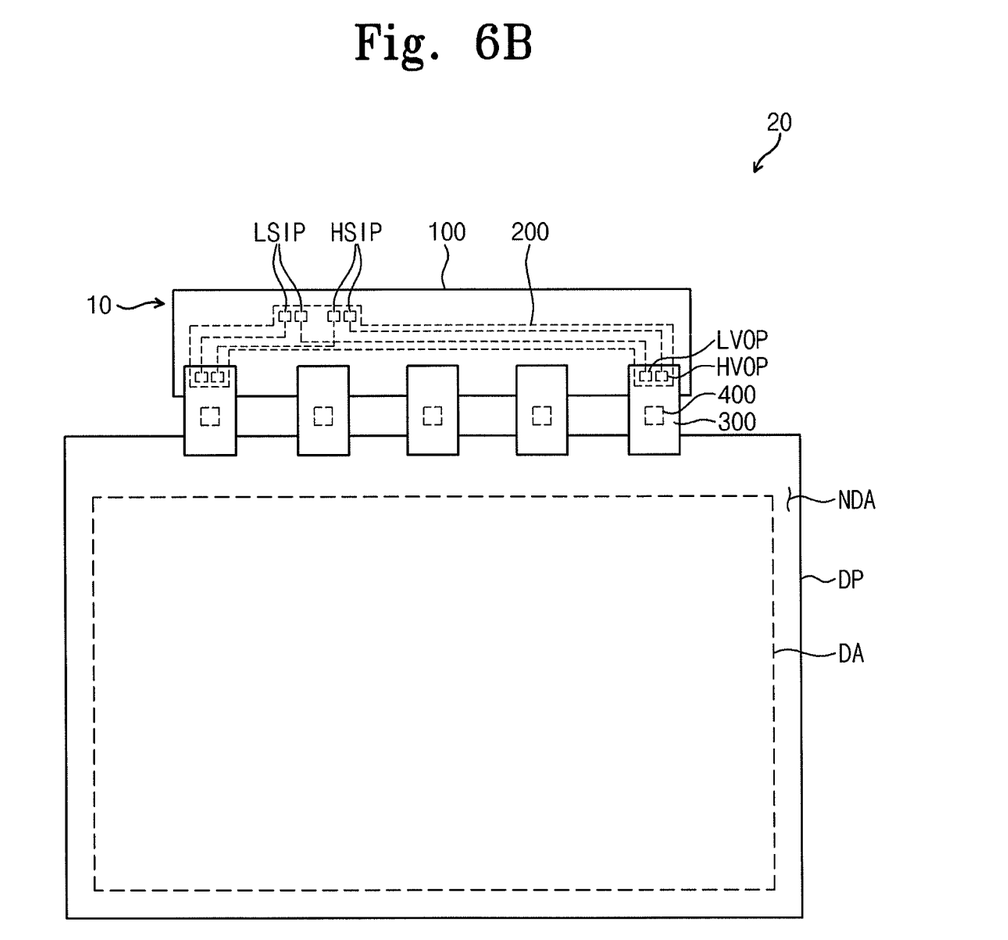
Figure 7:
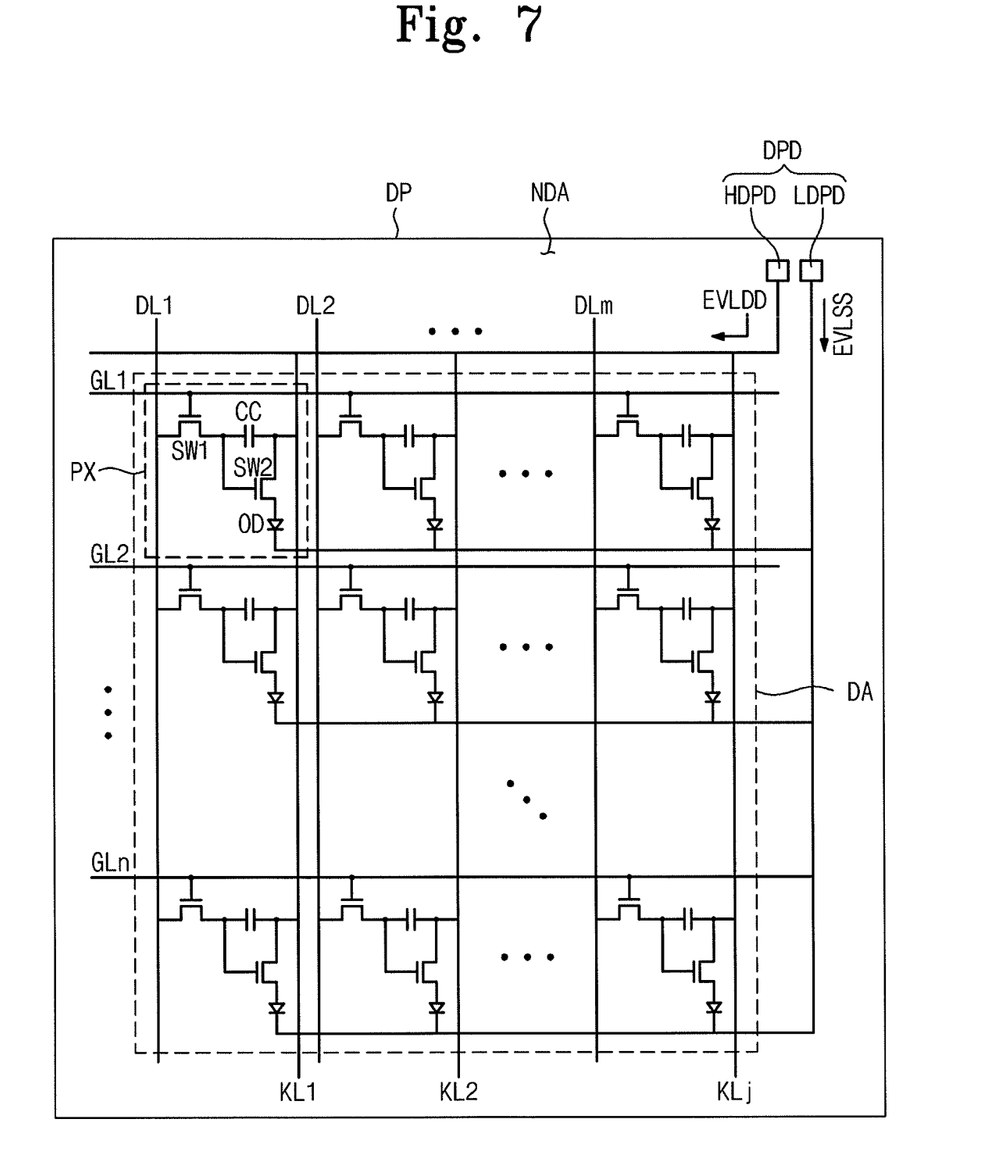
FIG. 7 illustrates a circuit diagram of an exemplary embodiment of the display device illustrated in FIGS. 6A and 6B.

FIGS. 6A and 6B illustrate a top-plan view and a bottom-plan view, respectively, of an exemplary embodiment of a display device 20. FIG. 7 illustrates a circuit diagram of an exemplary embodiment of the display device 20 illustrated in FIGS. 6A and 6B.

In FIGS. 6A, 6B, and 7, constituent elements that are identical to those described in relation to FIGS. 1 through 5 are marked by the same reference numerals and, in general, only differences or features not described above will be described.

As illustrated in FIGS. 6A, 6B, and 7, the display device 20 may include a circuit board, e.g., 10a, that provides power supply voltages EVLSS, EVLDD to a display panel DP. While the exemplary circuit board 10a of FIGS. 1-4 is illustrated in the exemplary embodiment of FIGS. 6A, 6B, one or more embodiments of a circuit board, e.g., 10a, including one or more features described herein may be employed. The main circuit board 100 may be electrically connected to the display panel DP via Tape Carrier Packages (TCPs) 300. Each of the TCPs 300 can mount a driver chip 400.

The display panel DP is not limited to a specific type. For example, the display panel DP may include a liquid crystal display panel, an organic light emitting display panel, an electrophoretic display panel, an electrowetting display panel, and the like. In example embodiments, the display panel DP is the organic light emitting display panel.

The circuit board may be a circuit board described in relation to FIGS. 1 through 5. Thus, the circuit board includes a main circuit board 100 and a flexible circuit board 200. The circuit board provides the display panel DP with the power supply voltages EVLSS and EVLDD via power output pads LVOP and HVOP (refer to FIG. 4) that are provided at the other surface of the main circuit board 100.

The display panel DP includes a display area DA including a plurality of pixels PX and a non-display area NDA adjacent to the display area DA.

The display area DA is an area where an image is displayed. The non-display area NDA is an area where no image is displayed. Panel input pads LDPD and HDPD connected with the power output pads LVOP and HVOP are disposed at the non-display area NDA. A circuit board (not shown) provided at the TCP 300 electrically connects the first power output pad LVOP and the first panel input pad LDPD, and a circuit board (not shown) provided at the TCP 300 electrically connects the second power output pad HVOP and the second panel input pad HDPD. Thus, the first power supply voltage ELVSS is applied to the first panel input pad LDPD, and the second power supply voltage ELVDD is applied to the second panel input pad HDPD.

A part of the TCPs 300 can mount the driver chip 400 which includes a data driver. The data driver, as will be described below, provides second lines DL1 through DLm with a data signal. In the exemplary structure of FIGS. 6A, 6B, the main circuit board 100 and the display panel DP are electrically connected via the TCPs 300. However, the main circuit board 100 can be mounted directly at the display panel DP.

The display area DA includes a plurality of signal lines and a plurality of pixels. The signal lines includes a plurality of first lines GL1 through GLn extending along a first direction, a plurality of second lines DL1 through DLm extending along a second direction and electrically isolated from the first lines GL1 through GLn, and a plurality of third lines KL1 through KLj extending along the second direction. The first lines GL1 through GLn sequentially receive a gate signal, and the second lines DL1 through DLm receive a data signal. The third lines KL1 through KLj receive the second power supply voltage ELVDD.

The gate signal and the data signal may be provided from a gate driver (not shown) and a data driver (not shown), respectively. The gate driver and the data driver may be disposed at the display panel DP, provided at the main circuit board 100, or mounted at the TCP 300.

Each of the pixels PX includes a first switching element SW1, a second switching element SW2, a capacitor CC, and an organic light emitting diode OD. The pixels PX may further comprise different color filters. The organic light emitting diodes OD of the respective pixels PX may generate lights of different colors. The pixels PX are formed to have the same function and configuration. For this reason, one pixel will be more fully described.

An anode electrode of the organic light emitting diode OD receives the second power supply voltage ELVDD, and a cathode electrode thereof receives the first power supply voltage ELVSS applied to the first panel input pad LDPD.

The first switching element SW1 is connected to one of the first lines GL1 through GLn and one of the second lines DL1 through DLm. A gate electrode of the first switching element SW1 is connected to the one first line, and a first electrode is connected to the one second line.

One terminal of the capacitor CC is connected to a second electrode of the first switching element SW1. The other terminal of the capacitor CC is connected to one of the third lines KL1 through KLj.

Herein, the first electrode is one of a source electrode and a drain electrode, and the second electrode is the other of the source electrode and the drain electrode. For example, the first electrode is a source electrode, and the second electrode is a drain electrode.

A gate electrode of the second switching element SW2 is connected to one terminal of the capacitor CC, and a first electrode thereof is connected to the other terminal of the capacitor CC. A second electrode of the second switching element SW2 is connected to the anode electrode of the organic light emitting diode OD. The second switching element SW2 controls the amount of current flowing via the organic light emitting diode OD according to a voltage value stored in the capacitor CC. At this time, the organic light emitting diode OD generates a light corresponding to the amount of current supplied from the second switching element SW2.

One or more embodiments of a circuit board, e.g., 10, 10a, provide a simplified circuit wiring structure and/or enable cost to be reduced. One or more embodiments may provide a circuit board including a separate board for wirings, e.g., power supply wirings, etc., which may be more prone to causing interference, etc., to enable such wirings or components to be further separated from other devices or components of a main circuit board of the circuit board. Further, since a power supply voltage is not transferred via a circuit wiring at an inner layer, it does not affect peripheral signal terminals. Thus, it is possible to reduce signal interference.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A circuit board for a display device having a display panel, comprising:
   a main circuit board including a power input pad to be supplied with a power supply voltage and a power receiving pad, the power input pad and the power receiving pad being defined at a first side of the main circuit board and externally exposed; and
   a flexible circuit board including a circuit wiring, the flexible circuit board facing the first side of the main circuit board, wherein
   the circuit wiring of the flexible circuit board electrically connects the power input pad and the power receiving pad of the main circuit board, wherein the display panel includes a plurality of pixels and a panel input pad receiving the power supply voltage through the flexible circuit board and the main circuit board.

2. The circuit board of claim 1, wherein:
   the power input pad includes a first power input pad supplied with a first power supply voltage and a second power input pad supplied with a second power supply voltage different from the first power supply voltage, and
   the power receiving pad includes a first power receiving pad and a second power receiving pad adjacent to the first power receiving pad, and wherein
   the first power receiving pad electrically connected to the first power input pad through the circuit wiring of the flexible circuit board, and the second power receiving pad electrically connected to the second power input pad through the circuit wiring of the flexible circuit board.

3. The circuit board of claim 2, wherein the main circuit board further includes:
   a first power output pad and a second power output pad electrically connected to the first power receiving pad and the second power receiving pad, respectively, and wherein
   the first power output pad and the second power output pad are provided at a second side of main circuit board that is opposite to the first side of the main circuit board at which the first and second power receiving pads are provided, and wherein
   the first power output pad and the first power receiving pad electrically connected to each other penetrating the main circuit board and the second power output pad and the second power receiving pad electrically connected to each other penetrating the main circuit board.

4. The circuit board of claim 2, wherein the flexible circuit board further comprises a flexible base member, wherein the circuit wiring of the flexible circuit board is provided at the flexible base member.

5. The circuit board of claim 4, wherein the circuit wirings of the flexible circuit board comprises:
   a first circuit wiring electrically connecting the first power input pad and the first power receiving pad; and
   a second circuit wiring electrically connecting the second power input pad and the second power receiving pad.

6. The circuit board of claim 5, wherein the flexible base member includes a plurality of insulation layers that are sequentially stacked, the first circuit wiring and the second circuit wiring being respectively provided on a surface of different ones of the insulation layers.

7. The circuit board of claim 6, wherein each of the first and second circuit wirings includes:
   a first pad portion exposed to the outside;
   a second pad portion spaced apart from the first pad portion and exposed to the outside; and
   a wiring portion connecting the first pad portion and the second pad portion.

8. The circuit board of claim 7, wherein the first pad portion of the first circuit wiring and the first power input pad are connected by a conductive material, and the second pad portion of the first circuit wiring and the first power receiving pad are connected by a conductive material.

9. The circuit board of claim 7, wherein the first pad portion of the second circuit wiring and the second power input pad are connected by a conductive material, and the second pad portion of the second circuit wiring and the second power receiving pad are connected by a conductive material.

10. The circuit board of claim 4, wherein the main circuit board further includes a first signal terminal and a second signal terminal each being exposed to the outside, and
    wherein the circuit wirings of the flexible circuit board further includes a third circuit wiring connecting the first signal terminal and the second signal terminal.

11. The circuit board of claim 10, wherein the third circuit wiring comprises:
    a first pad portion exposed to the outside and connecting with the first signal terminal;
    a second pad portion exposed to the outside and connecting with the second signal terminal; and
    a wiring portion connecting the first pad portion and the second pad portion.

12. The circuit board of claim 1, wherein the power input pad and the power receiving pad are arranged along a peripheral portion of the main circuit board.

13. The circuit board of claim 1, wherein the circuit wiring of the flexible circuit board overlaps at least a portion of a central portion of the main circuit board.

14. The circuit board of claim 1, wherein the flexible circuit board includes a circuit wiring, through which the flexible circuit board connects the power input pad and the power receiving pad.

15. A display device, comprising:
  a main circuit board including a power input pad provided at a first side thereof and receiving a power supply voltage from an exterior, a power receiving pad provided at the first side of the main circuit board, and a power output pad provided at a second side of the main circuit board, which is opposite to the first side, and electrically connected to the power receiving pad through the main circuit, wherein the power input pad, the power receiving pad, and the power output pad are exposed to the outside;
  a flexible circuit board coupled to the first side of the main circuit board and electrically connecting the power input pad and the power receiving pad through the flexible circuit board; and
  a display panel, the display panel including a plurality of pixels and a panel input pad receiving the power supply voltage from the exterior through the flexible circuit board and the main circuit board.

16. The display device of claim 15, wherein the display panel comprises:
  a display area having a plurality of signal lines and the plurality of pixels respectively connected to the plurality of signal lines; and
  a non-display area adjacent to the display area, the panel input pad being disposed at the non-display area.

17. The display device of claim 16, wherein each of the plurality of pixels includes an organic light emitting diode emitting a light in response to the power supply voltage.

18. The display device of claim 15, wherein:
  the power output pad of the main circuit board includes a first power output pad to output a first power supply voltage and a second power output pad to output a second power supply voltage different from the first power supply voltage, and
  the panel input pad of the display panel includes a first panel input pad electrically connected to the first power output pad of the main circuit board and a second panel input pad electrically connected to the second power output pad of the main circuit board.

19. The display device of claim 18, wherein:
  the power input pad includes a first power input pad supplied with the first power supply voltage and a second power input pad supplied with the second power supply voltage; and
  wherein
  the first power receiving pad and the first power input pad are electrically connected to each other through the flexible circuit board,
  the first power receiving pad and the first power output pad are electrically connected to each other through the main circuit board,
  the second power receiving pad and the second power input pad are electrically connected to each other through the flexible circuit board, and
  the second power receiving pad and second power output pad are electrically connected to each other through the main circuit board.

20. The display device of claim 19, wherein the flexible circuit board comprises:
  a first circuit wiring connecting the first power input pad and the first power receiving pad; and
  a second circuit wiring connecting the second power input pad and the second power receiving pad.

21. The display device of claim 20, wherein the flexible circuit board further comprises a plurality of insulation layers being sequentially stacked, and the first and second circuit wirings are provided on a surface of different ones of the insulation layers.

* * * * *